United States Patent
Vromans

(10) Patent No.: US 8,509,346 B2
(45) Date of Patent: * Aug. 13, 2013

(54) TRANSMITTER WITH REDUCED POWER CONSUMPTION AND INCREASED LINEARITY AND DYNAMIC RANGE

(75) Inventor: Jan S. Vromans, Maastricht (NL)

(73) Assignee: ST-Ericsson SA, Plan-les-Ouates (CH)

( * ) Notice: Subject to any disclaimer, the term of this patent is extended or adjusted under 35 U.S.C. 154(b) by 323 days.

This patent is subject to a terminal disclaimer.

(21) Appl. No.: 12/734,082

(22) PCT Filed: Oct. 7, 2008

(86) PCT No.: PCT/IB2008/054106
§ 371 (c)(1),
(2), (4) Date: Sep. 22, 2010

(87) PCT Pub. No.: WO2009/047705
PCT Pub. Date: Apr. 16, 2009

(65) Prior Publication Data
US 2011/0007838 A1    Jan. 13, 2011

(51) Int. Cl.
*H04K 1/02* (2006.01)
(52) U.S. Cl.
USPC ......................................................... 375/296
(58) Field of Classification Search
USPC ......................................................... 375/296
See application file for complete search history.

(56) References Cited

U.S. PATENT DOCUMENTS

| | | | |
|---|---|---|---|
| 5,617,058 A | 4/1997 | Adrian et al. | |
| 6,147,553 A | 11/2000 | Kolanek | |
| 6,311,046 B1 | 10/2001 | Dent | |
| 6,754,287 B2 | 6/2004 | Underbrink et al. | |
| 6,838,931 B2 * | 1/2005 | Midya et al. | 330/10 |
| 6,993,087 B2 | 1/2006 | Rosnell et al. | |
| 7,945,224 B2 * | 5/2011 | Sorrells et al. | 455/127.1 |
| 2004/0246060 A1 * | 12/2004 | Varis et al. | 332/109 |
| 2006/0181345 A1 | 8/2006 | Saed | |
| 2007/0018718 A1 * | 1/2007 | Horng et al. | 330/10 |
| 2008/0001660 A1 * | 1/2008 | Rasmussen | 330/10 |

FOREIGN PATENT DOCUMENTS
WO    WO 2007/060562 A1    5/2007

OTHER PUBLICATIONS

International Search Report dated Feb. 2, 2009 in connection with PCT Patent Application No. PCT/IB2008/054106.
Written Opinion of the International Searching Authority dated Feb. 2, 2009 in connection with PCT Patent Application No. PCT/IB2008/054106.
S. Rosnell, et al., "Bandpass Pulse-Width Modulation (BP-PWM)", IEEE Microwave Symposium, Jun. 17, 2005, p. 731-734.

* cited by examiner

*Primary Examiner* — Juan A Torres
(74) *Attorney, Agent, or Firm* — Coats & Bennett, P.L.L.C.

(57) ABSTRACT

This application relates to an apparatus comprising a signal generator configured to generate a signal. The apparatus encompasses a predistortion unit configured to pre-distort the generated signal. The apparatus includes a pulse width modulating unit configured to modulate the pre-distorted signal into at least two signals. The apparatus comprises at least two amplifying units each configured to amplify one of the two modulated signals.

23 Claims, 11 Drawing Sheets

TRANSMITTER WITH REDUCED POWER CONSUMPTION AND INCREASED LINEARITY AND DYNAMIC RANGE

CROSS-REFERENCE TO RELATED APPLICATION(S)

The present application claims priority under 35 U.S.C. §365 to International Patent Application No. PCT/IB2008/054106 filed Oct. 7, 2008, entitled "TRANSMITTER". International Patent Application No. PCT/IB2008/054106 claims priority under 35 U.S.C. §365 and/or 35 U.S.C. §119(a) to European Patent Application No. 07118223.2 filed Oct. 10, 2007 and which are incorporated herein by reference into the present disclosure as if fully set forth herein.

FIELD OF THE INVENTION

The application relates to an apparatus and method for modulating signals onto at least two carrier signals and a transmitter. Moreover, the application relates to a computer readable medium having a computer program stored thereon for modulating signals onto at least two carriers.

BACKGROUND OF THE INVENTION

Transmitters are widely used in several application areas, like mobile radio or satellite technology. It is important for systems of such technology areas that energy consumption is small due to the limited power supply. Thus, it is an ongoing concern of the industry to reduce power consumption of transmitters.

One possible solution is to use power efficient amplifiers, like switching power amplifiers. However, switching power amplifiers has to be driven by a signal comprising a good linearity. Due to this fact suitable modulation methods, like pulse width modulation (PWM) or pulse density modulation (PDM) are essential.

Moreover, it is an ongoing concern of the industry to increase the transfer rate. One possibility is to use the amplitude and the phase as well as information carriers to achieve a more efficient modulation scheme. However, this implicates linearity issues, in particular in connection with switching power amplifiers.

In prior art several solutions are used, like combined analogue loop universal modulator (CALLUM) or sigma delta. The needed linearity of the signals being transmitted is obtained by implementing a feedback loop. However, the used feedback loops encompass issues of loop stability and operate over a large range.

Document WO 2005119904 discloses a PWM modulator with power combining at the output of two power amplifiers. A feedback loop is arranged to obtain the needed linearity of the depicted radio frequency (RF) input signal. However, implementing the shown architecture is complex. According to the shown PWM modulator, a feedback loop is essential to obtain the needed linearity.

It is one object of the present application to provide reduced power consumption of the apparatus. A further object is to increase the linearity of the signal being amplified. A further object is to increase the dynamic range of the apparatus.

SUMMARY OF THE INVENTION

These and other objects are solved by an apparatus comprising a signal generator configured to generate a signal. The apparatus encompasses a predistortion unit configured to pre-distort the generated signal. The apparatus includes a pulse width modulating unit configured to modulate the pre-distorted signal into at least two signals. The apparatus comprises at least two amplifying units each configured to amplify one of the two modulated signals.

The apparatus may be implemented within a transmitting device for transmitting any kind of information, like data, speech or the like. Furthermore, the apparatus can be implemented at least partially within a digital domain as well as within an analogue domain.

Moreover, the apparatus encompasses a signal generator. The signal generator may create a signal depending on the information being transmitted. The signal may be a base band signal. The information being transmitted may be inserted at least within the amplitude component of the generated signal.

In addition, a predistortion unit is arranged. The predistortion unit pre-distorts the generated signal. In particular, the amplitude component or the envelope can be pre-distorted. It is found, according to the present application that the predistortion unit may predict non linear behavior of following employed units. It is further found that the predistortion unit may be used to obtain at least one signal comprising an almost constant envelope.

The pre-distorted signal is modulated by the pulse width modulating unit. The pre-distorted signal comprising the information being transmitted can be modulated onto at least two signals having the same carrier frequency by this pulse width modulating unit. The advantage of a pulse width modulated signal is that the modulated signal comprises an almost constant envelope.

What is more, the apparatus encompasses at least two amplifying units. The two amplifying units may also be one amplifying unit comprising two amplifying stages. Each of the amplifying units amplifies one of the modulated signals. The modulated signals can be amplified independently to each other. The used modulation form is especially suitable for the arranged amplifying units.

By using a predistortion unit the signal being amplified comprises a good linearity. A feedback loop may be omitted. By using two amplifying units and the predistortion unit the dynamic range can be improved.

According to one embodiment, the created signal may be a polar signal. A polar signal comprises generally an amplitude component and a phase component. The transfer rate can be increased due to the fact that both the amplitude component and the phase component can be used as information carriers. The polar signal can be split into an amplitude component and a phase component. The amplitude component is in accordance with the envelope of the polar signal. It is found that merely the amplitude component of the polar signal can be forwarded to the predistortion unit for improving its linearity. The use of the high frequency component of the amplitude may be advantageous. The dynamic range can be improved.

According to a further embodiment, at least one amplifying unit can be implemented as a switching power amplifying unit within the apparatus for reducing power consumption. A switching amplifying unit may encompass at least one input for the signal being amplified and at least one input for voltage supply. Such a switching unit can be employed in combination with suitable modulation methods, like pulse width modulation (PWM). The switching power amplifier may be a class D or class E amplifier. These types of power amplifiers are especially suitable due to their small power consumption. However, similar amplifying devices can also be implemented into the apparatus according to the application. The present apparatus according to embodiments may provide a significant power consumption reduction.

In one embodiment of the present application, the two amplified signal are combined to a single signal being transmitted by a combining unit. The obtained signal may include the information being transmitted and may comprise a suitable transmission power. A transformer, combiner or the like can be implemented as a combining unit. Furthermore, the combining unit can be realized in micro-strip technology. An implementation of such a combining unit can be performed with low effort and costs.

Additionally, the amplifying units and an amplifying unit comprising a two amplifier stage, respectively, can be realized in a current mode or voltage mode concept. Depending on the used concept, a low pass filter, like a series resonance circuit or parallel resonance circuit can be arranged at the output of the combining unit. Folding in fast Fourier Transformation can be avoided.

According to another embodiment, the arranged predistortion unit can be arranged to determine a phase shift function depending on the generated signal, for instance, the amplitude component of a polar signal. It is found according to embodiments that the modulated signal should be substantially linear for applying switching amplifying units. This predistortion unit may be configured to determine a phase shift function depending on the generated signal, for example of the amplitude component. For achieving a substantially linear signal, the predistortion unit may convert and bias the amplitude component into a suitable phase shift function containing the signal information, for example the amplitude component information. Furthermore, the predistortion unit may enable in an advantageous manner to calculate a proper phase shift function for further processing, like modulating the phase shift function via pulse width modulation onto at least two carrier signals having the same carrier frequency.

Moreover, the predistortion unit may comprise a first determining unit to determine a duty cycle function depending on the generated signal, for example, the amplitude component of a polar signal. According to the present application it is found that the desired phase shift function may depend on the duty cycle. The duty cycle depending in turn on the amplitude component may be calculated according to an implemented suitable algorithm. For example, the duty cycle can be calculated by the arcsine function used on the amplitude and a constant multiplication factor. The found dependency of the duty cycle and the generated signal, in particular the amplitude component of a polar signal, may enable an implementation with low effort and costs.

The predistortion unit may also comprise a second determining unit for determining the desired phase shift function depending on the duty cycle function. It is found that the phase shift function depends linearly on the obtained duty cycle function taken additionally the maximum constant phase shift into account. Thus the needed algorithm can be implemented easily.

The predistortion unit may comprise further units, like limiting units or normalization units. However, a person skilled in the art is able to implement such components if the components are needed.

According to another embodiment, the apparatus may comprise a pulse position modulating unit configured to process a phase component of the generated signal. It is found that using the phase component as information carrier increases the transfer rate. Pulse position modulating (PPM) may be a suitable modulation form. Such a pulse position unit can be implemented in an easy manner and separated from the pulse width modulating unit.

By the way it is found that for the phase component of a polar signal a predistortion unit or the like is not essential due to the linear relation between the wanted phase modulation and the phase component.

What is more, the pulse position modulating unit may comprise a first mapping unit configured to map the phase component of the polar signal to at least one suitable function according to a chosen implementation of the pulse position modulating unit. Suitable functions may be trigonometric functions, like sine and/or cosine functions. The input signal of the mapping unit, like the phase component, may be mapped onto at least one of the above mentioned functions. There are several options for mapping, like using a CORDIC algorithm or a ROM table. The use of such options may reduce computing expenditure. The mapping unit may be realized digitally. However, an analogue implementation may be possible as well.

Furthermore, the pulse position unit may comprise a first up converting unit. This unit may be arranged for modulating the information included in the phase component and the suitable mentioned function, respectively, onto at least one carrier signal. The carrier signal may be a signal comprising a cosine and/or sine function.

A signal having any suitable frequency can be used as a carrier signal. A voltage control oscillator (VCO), a voltage controlled crystal oscillators (VCXO) or the like may generate the carrier signal.

According to another embodiment of the present application, the pulse width modulating unit may comprise a second mapping unit configured to map the phase shift function to at least one suitable function according to a chosen implementation of the pulse width modulating unit. This second mapping unit can be implemented similar to the first mapping unit taken another possible format of the input signal into account.

Additionally, the pulse width modulating unit may comprise also a second up converting unit which can be realized similar to the first up converting unit. Advantageously, merely one carrier signal generator, like a VCO, may be used for both, the pulse width modulating unit and pulse position modulating unit.

An up converting unit may comprise several calculating units to modulate the input signals, like the phase shift function and/or phase component and the corresponding function mentioned above, respectively, onto at least two carrier signals. For instance, the modulating unit may comprise at least one multiplying unit and/or at least one addition unit and/or at least one signum unit. A comparator can be employed as a signum unit. However, other arrangements comprising other logic and/or calculating units are possible.

Generally there are several methods to generate a pulse width modulated signal like using a saw or triangular signal. It is found that a pulse width modulated signal can be created with the aid of two opposite shifted carrier signals. The carrier signal may be opposite phase shifted at least by the determined phase shift function. The two opposite shifted carrier signals may be obtained by a calculating network comprising calculating units, like multipliers, summers and/or signum units. Depending on the phase component, the two carrier signals may be shifted additionally into same direction.

Pulse width modulating unit and pulse position modulating unit may be implemented as one pulse width pulse position modulating unit. This unit may comprise merely one mapping unit and one up converting unit. The phase component and the pre-distorted amplitude component both may be fed to the pulse width pulse position modulating unit. A realization of the pulse width pulse position modulating unit can be performed with small effort and reduced costs.

For further improving the linearity the apparatus according to one embodiment of the present application may additionally comprise a feedback loop path. A feedback loop may be used to correct the generated signal comprising the information depending on the combined signal being transmitted. In general, the feedback loop can be implemented entirely within the analogue domain which may be called short or local feedback loop, as well as at least partly within the digital domain which may be called long feedback loop. Correction of the generated signal, especially of the polar signal, within the digital domain can easily be performed. The advantage of an implementation within the analogue domain may be that a bandwidth limitation can be avoided.

According to a further embodiment, the feedback loop path may comprise a converting unit configured for down converting the combined signal. This converting unit may comprise at least one multiplier and/or at least one low pass filter and/or at least one delay element. For correcting the generated signal, for example a base band signal, the combined signal may be down converted onto the frequency of the generated signal. The arranged carrier signal generator for up converting can be used for down converting. An implementation can be performed easily.

Moreover, the feedback loop path may encompass a processing unit configured to correct the generated signal depending on the down converted signal. Due to the fact that the signal being modulated may be split into an amplitude component and a phase component at least one of the corresponding components of the combined signal may be detected. Thus at least an envelope detecting unit and/or phase detecting unit may be arranged within the processing unit according to embodiments of the application. It may be advantageously to detect both the amplitude component and phase component of the combined signal for correcting the respective components of the polar signal. An improved result can be achieved.

The processing unit may be realized entirely within the digital domain. A digital signal processor (DSP) or the like may be employed as processing unit. For example, suitable algorithm can be implemented for detecting the phase and/or amplitude component of the down converted signal. A realization may depend on the chosen feedback loop according to the above mentioned possibilities.

Furthermore, the processing unit may include a comparing unit. The comparing unit may compare the detected amplitude component of the combined signal with the amplitude component generated by the signal generator. A comparator or the like can be used as a comparing unit. The processing unit may comprise a further comparing unit. For the further comparing unit a comparator or the like may be employed, to compare the detected phase component of the combined signal with the phase component generated by the signal generator. However, several possibilities for implementation are possible.

In addition, the processing unit according to the present application may further comprise at least one integrator unit. Advantageously, two integrator units may be arranged within the processing unit. The integrator units can be arranged following the comparing units. Further the integrator units may be used for correcting the phase component and amplitude component depending on the compared phase signal and amplitude signal, respectively. The corrected phase component can be fed to the pulse position modulating unit and pulse width pulse position modulating unit, respectively, meanwhile the corrected amplitude component can be fed to the predistortion unit. The combination of comparing units and the integrator units may yield to a good result with low effort.

According to another embodiment, the feedback loop path may encompass a down converting and error detecting unit. This unit may be realized entirely analogue. Several components may be arranged within this unit, like integrator, low pass filter, delay element, comparing unit, multiplier and the like. The a down converting and error detecting unit may be configured to convert the measured combined signal down and to detect an error, like an phase and/or amplitude error, subsequently. This unit may also be realized entirely analogue.

Furthermore, the feedback loop path may comprise an amplitude and/or phase correcting unit according to another embodiment of the present application. This unit may be configured to correct the signals being amplified depending on the error signals obtained by the down converting and error detecting unit. For instance, the mapped functions and/or the up converted signals may be corrected by the amplitude and/or phase correcting unit.

In a further embodiment the feedback loop path may comprise a phase shifting unit for correcting the phase component. Depending on a determined phase error signal, the phase component may be corrected. For example, a filtering unit can be arranged for varying the phase by controlling a resistor, varicap or the like. Advantageously, an all pass filter having a varying delay can be chosen. An improved linearity can be achieved.

What is more, the pulse width modulating unit may comprise a third up converting unit. A third up converting unit may be used for correcting the amplitude component easily. Further units like multipliers and adders can be arranged to combine the modulated signals suitably for correcting the amplitude component.

Another embodiment may include a feedback loop path comprising a phase correction unit. The phase correction unit may include at least one multiplier and one adder. However, other implementations are possible. An obtained phase error signal can be used as an input signal of the phase correction unit. The phase error detection can be performed independently from the RF frequency. What is more, the implemented feedback loop may be short.

Another aspect of the present application is a method comprising generating a signal. The method encompasses pre-distorting the generated signal. The method includes modulating the pre-distorted signal onto at least two signals. The method comprises amplifying at least the two modulated signals.

A further aspect of the present application is a computer readable medium having a computer program stored thereon. The computer program comprises instructions operable to cause a processor to perform at least the above mentioned method.

The present application can be deployed in several application areas which include efficient modulated transmitters. The transmitters can be used for WLAN, WPAN, Bluetooth, OFDM, GSM, UMTS, CDMA, low power mobile communication devices and the like.

It should be denoted that only elements relevant to the principle of the present application are explained above. Components, like delay elements or analog digital converter are omitted. However, a person skilled in the art is able to implement such components if the components are needed.

Further should be denoted that the amplifying units can be supplied by a voltage depending on the amplitude component of the generated signal. For example, a low pass filter can be arranged to filter the amplitude component. The filtered signal can be forwarded to a DC-DC converter which can supply a voltage to at least one of the amplifying units, in particular to both units. A further high pass filter can also be arranged. The high frequency component of the amplitude component can be fed to the predistortion unit. Other implementations for supplying a voltage to the amplifying units are possible. Less power consumption can be achieved.

These and other aspects of the present patent application become apparent from and will be elucidated with reference to the following figures. The features of the present application and of its exemplary embodiments as presented above are understood to be disclosed also in all possible combinations with each other.

BRIEF DESCRIPTION OF THE DRAWINGS

In the figures show.

DETAILED DESCRIPTION OF THE DRAWINGS

In the following detailed description of the present application, exemplary embodiments of the present application will describe and point out the architecture of the apparatus which make it possible to reduce power consumption. Furthermore, it will be elucidated by the exemplary embodiments to increase the linearity of the signal being amplified and the dynamic range.

Figure 1:
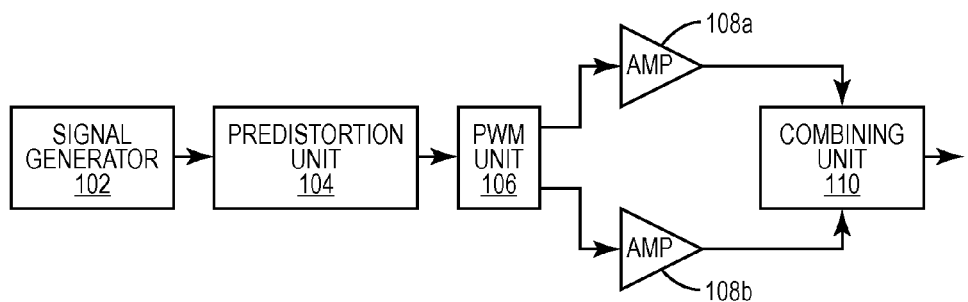
FIG. 1 a first embodiment of the apparatus according to the application.

FIG. 1 shows an exemplary simplified embodiment of the apparatus according to the present application. The shown apparatus can generally be implemented in an analogue way or partly within the digital and partly within the analogue domain.

According to this embodiment the apparatus comprises a signal generator 102 which is connected to a predistortion unit 104. Both units 102, 104 may be implemented within the digital domain. For instance, the signal generator may be a digital base band processor which generates at least one signal. The signal, for example an amplitude component including the information being transmitted of the generated signal, may be forwarded to the predistortion unit 104.

The predistortion unit 104 may comprise suitable components to realize the essential algorithms for predistortion. An elucidation of one embodiment of the predistortion unit 104 according to the present application occurs subsequently.

The signal created by the predistortion unit 104 is fed to the pulse width modulating unit 106 which will be described in more detail subsequently. In general, the modulating unit 106 may modulate the incoming signal at least onto two signals. The two signals may have a suitable carrier frequency. The pulse width modulating unit 106 may be realized partly analogue and partly digitally.

In turn, the pulse width modulating unit 106 is connected to two amplifying units 108a, 108b by different paths. The amplifying units 108a, 108b may be switching power amplifiers, like class D or class E amplifiers. The two amplifying units 108a, 108b may also be called a two power amplifier stage. These types of amplifiers offer the advantage of being very efficient. However, according to other variants of the present application, employing different amplifiers is possible.

The two amplified signals are combined to a single signal by a combining unit 110 arranged at the outputs of the amplifying units 108a, 108b. The combining unit 110 may be realized by a transformer, combiner or the like.

Figure 2:
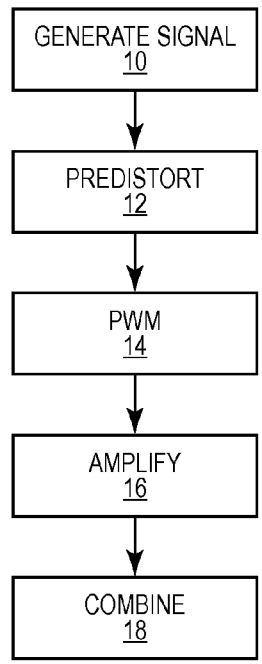
FIG. 2 an exemplary flowchart of the method according to the application.

In FIG. 2 an exemplary flowchart of the method according to the present application is depicted to demonstrate its functioning in general.

In the first step 10 a signal is generated by a signal generator 102. The signal may be a digital base band signal with at least an amplitude component acting as information carrier.

In the next step 12 the generated signal, in particular the amplitude component, is processed by the predistortion unit 104. Advantageously the amplitude component may be converted and pre-distorted into a phase shift function representing the amplitude information.

The pulse width modulating unit 106 modulates properly the pre-distorted signal onto two carrier signals having the same desired carrier frequency in step 14. For example, the phase shift function may be mapped onto suitable functions, like trigonometric functions. Then the functions can be up converted by multipliers and other calculating units onto at least two carrier signals.

In the following step 16 the two modulated signal are amplified to an appropriate transmitting power. The step 16 is performed by the arranged amplifying units 108a, 108b.

In the last step 18, a combining unit 110 may add the two amplified signals to a single signal containing the information being transmitted. The signal can be transmitted via an antenna device or the like.

A transmitter should offer a good linearity for the case a switching power amplifier, like a class D or E amplifier, is used for reducing power consumption. Pulse width modulated signals are suitable to obtain a good linearity.

Figure 3:
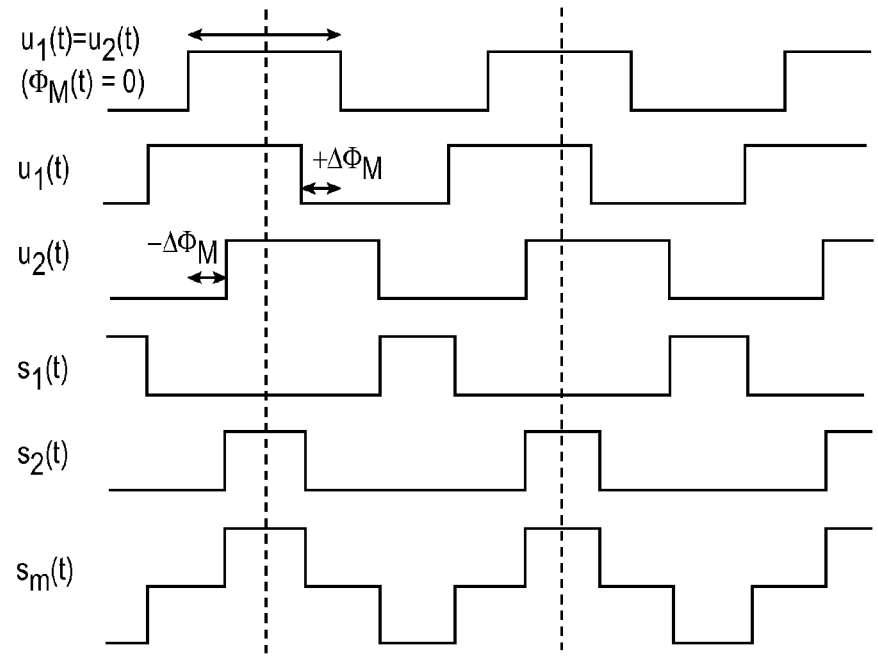
FIG. 3 a first exemplary diagram to create a pulse width modulated signal.

There are several methods to generate a pulse width modulated signal (PWM signal), like applying a saw or triangular signal. The present method and apparatus for performing the respective method are especially suitable for the used at least two amplifying units 108a, 108b. A PWM signal can be done with the aid of two opposite shifted carriers. FIG. 3 shows signals $u_1(t)$ and $u_2(t)$ which are opposite phase shifted by $\Delta\Phi_M$.

The phase shift signal or function $\Phi_M(t)$ includes the information of the amplitude component A being transmitted. For simplification reasons only a constant phase shift $\Delta\Phi_M$ is shown according to FIGS. 3 and 4. It will be explained subsequently how the phase shift signal $\Phi_M(t)$ can be obtained.

The illustrated signal $s_1(t)$ can be obtained using a NOR function of the opposite phase shifted signals $u_1(t)$ and $u_2(t)$. The second signal $s_2(t)$ can be determined by an AND function of the signals $u_1(t)$ and $u_2(t)$. However, according to the present application, it is found that the implementation of an AND and NOR function can be omitted by using two amplifying units 108a, 108b and a combining unit 110. One amplifying unit 108a may be driven by signal $u_1(t)$ and the other amplifying unit 108b may be driven by signal $u_2(t)$. A detailed implementation of the apparatus will be elucidated subsequently.

Figure 4:
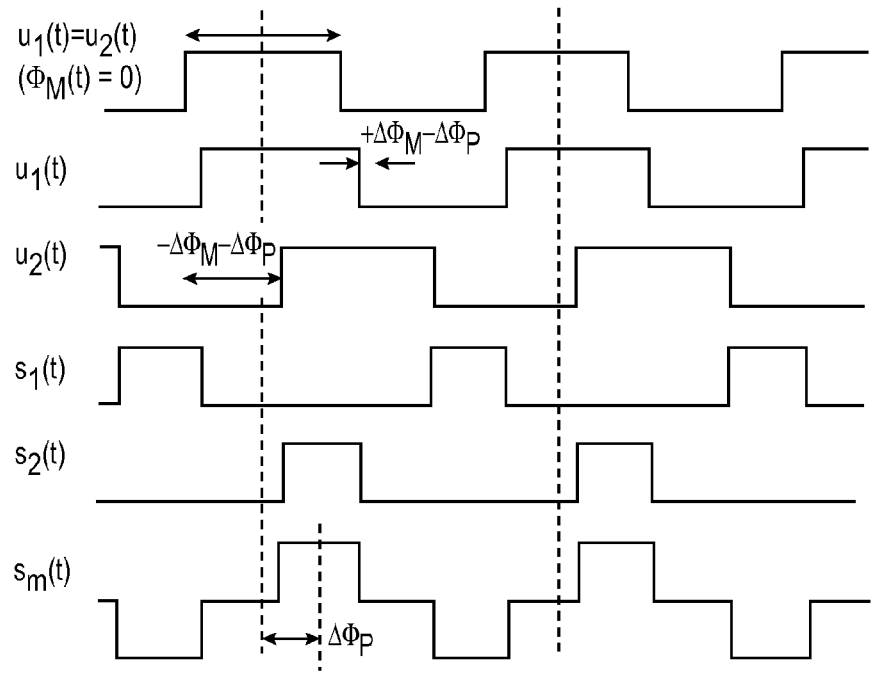
FIG. 4 a second exemplary diagram to create a pulse width modulated signal having an additional phase shift depending on the pulse position modulation.

FIG. 4 shows similar signals compared to FIG. 3. The difference between the two diagrams according to FIGS. 3 and 4 is an additional phase shift $\Delta\Phi_p$ depending on a pulse position modulated (PPM) modulation of the phase component $\Phi_p$ of the generated signal.

In the following a possible predistortion for deriving the desired phase shift function $\Phi_M(t)$ to achieve an almost linear signal for driving the non-linear amplifying units 108a, 108b is explained. By the aid of the following FIG. 5, it will be elucidated how the desired phase shift function $\Phi_M(t)$ which represents the amplitude information is determined.

Figure 5:
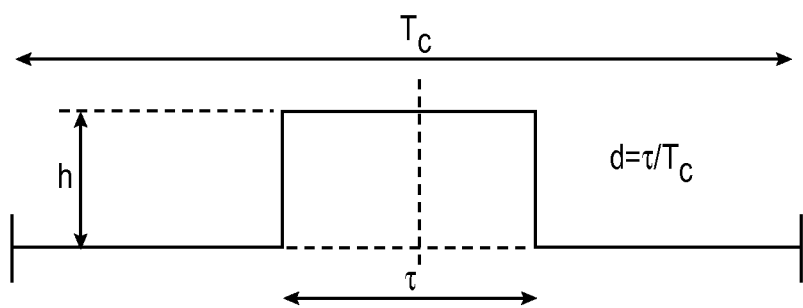
FIG. 5 an exemplary diagram of a pulse.

In FIG. 5 an exemplary diagram of a pulse is shown. The depicted pulse has a pulse length $\tau$ and a height h within a period $T_C$ corresponding to the carrier frequency $\omega_C$. Thus the duty cycle is $d=\tau/T_C$. Through Fourier series expansion the following equitation can be obtained $$f(t) = \frac{\tau h}{T_C} + \frac{2h}{\pi}\left[\sin\left(\frac{\tau}{T_C}\pi\right)\cos(\omega_C t) + \frac{1}{2}\sin\left(\frac{2\tau}{T_C}\pi\right)\cos(2\omega_C t) + \frac{1}{3}\sin\left(\frac{3\tau}{T_C}\pi\right)\cos(3\omega_C t) + ...\right]$$

Substitution of the duty cycle d and conversion of the function f(t) into a sum yield to $$f(t) = dh + \frac{2h}{\pi}\sum_{n=1}^{\infty}\frac{\sin(nd\pi)}{n}\cos(n\omega_C t).$$

This function represents the relation between the amplitudes of the fundamental frequency and its harmonics depending on the duty cycle d. The amplitude $A_n$ of the $n^{th}$ harmonic of the fundamental frequency as a function of the duty cycle is then given by $$A_n = \frac{2h}{\pi}\frac{\sin(nd\pi)}{n}.$$

$A_n$ reaches its maximum value $$A_{n,max} = \frac{2h}{\pi n}$$

for a duty cycle value $$d = \frac{1}{2n}.$$

According to embodiments of the present invention it has been found that for the applied PWM modulation method a continuously decreasing or increasing function $A_n(d)$ is needed. The range of the duty cycle d and thus the range of the amplitude $A_1$ representing the amplitude of the first harmonic are $$d \Rightarrow 0 \ldots 0.5 \text{ and } A_1 \Rightarrow 0 \ldots \frac{2}{\pi}.$$

Function $A_1$ is a continuously increasing or decreasing function. It is further found, according to the present application that an amplitude change of the $n^{th}$ harmonic of the pulse train may occur according to the next equitation $$d = \frac{1}{n\pi}\arcsin\left(\frac{n\pi A_n}{2h}\right).$$

The duty cycle d of the first harmonic signal is achieved by substitution of n=1 and h=1

$$d = \frac{1}{\pi}\arcsin\left(\frac{\pi A_1}{2}\right).$$

An envelope signal which may be normalized in the range from 0 to $2\pi$ will result in a linear AM modulation of the first harmonic fundamental of the pulse width modulated signal. It may be suitable to normalize the amplitude $A_{norm}$ to the range from 0 to 1 and as the final predistortion function $$d(t) = \frac{1}{\pi}\arcsin(A_{norm}(t))$$

is achieved. Thus a duty cycle function d(t) is obtained for the applied PWM-PPM modulation unit 104.

As may be seen from FIG. 3 the maximum phase shift is given by $$\hat{\Phi}_M = \frac{\pi}{2}.$$

The desired phase shift function $\Phi_M(t)$ can also be derived from FIG. 3. Depending on the duty cycle d(t) and the maximum phase shift $\hat{\Phi}_M$ the searched function $\Phi_M(t)$ is given by $$\Phi_M(t) = (1-2d(t))\hat{\Phi}_M.$$

This function $\Phi_M(t)$ which comprises the amplitude information being transmitted is suitable for the applied PWM modulation.

For the additional PPM modulation predistortion and conversion is not needed due to the linear relation between the wanted phase modulation $\Phi_P(t)$ and the phase component. Thus $\Phi_P(t)$ is given by the following equitation $$\Phi_P(t) = \arg(s_{baseband}(t))$$

Figure 6:
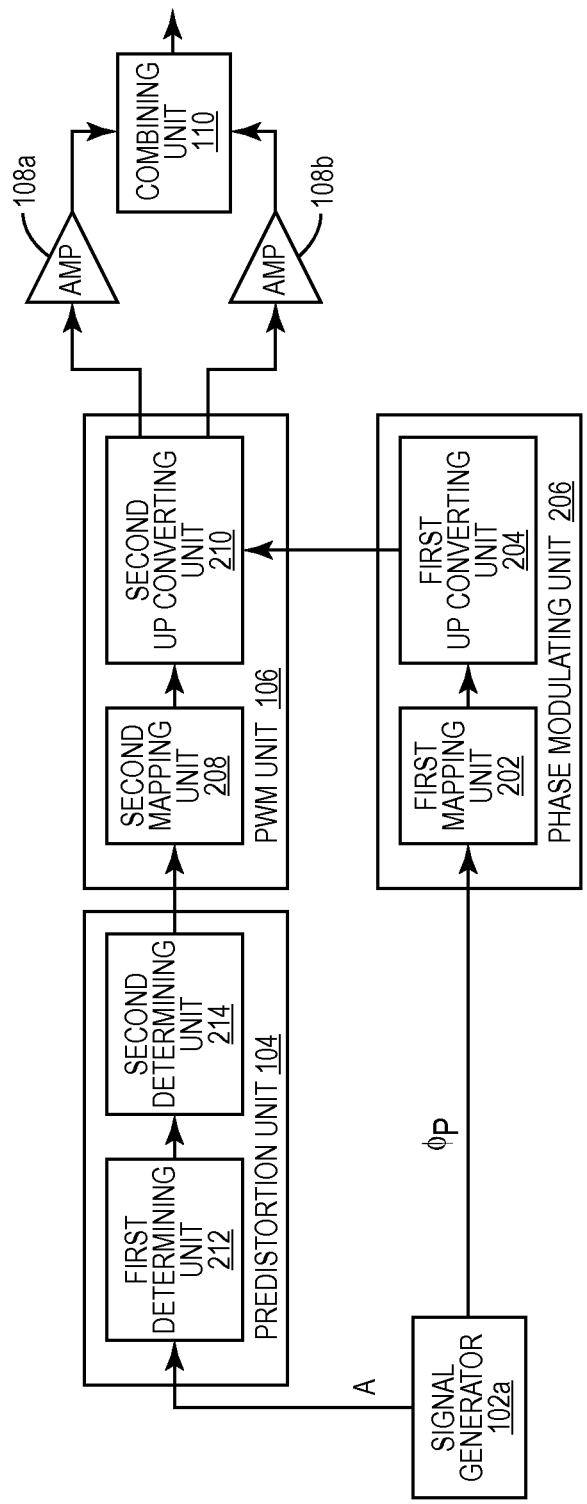
FIG. 6 a second embodiment of the apparatus according to the application.

FIG. 6 shows a further exemplary simplified embodiment of the apparatus according to the present application. The shown apparatus can be implemented in an analogue way or partly within the digital and partly within the analogue domain. The already known components are not explained again and hold the same reference signs.

The apparatus encompasses a signal generator 102a. The signal generator 102a depicted in this embodiment generates a base band polar signal. However, use of other signals is possible. This polar signal comprises an amplitude component A and a phase component $\Phi_P$. Both are used as information carriers according to the present embodiment. The phase component $\Phi_p$ is fed to a phase modulating unit 206.

More particularly, the phase component $\Phi_p$ is forwarded to a first mapping unit 202 included in the phase modulating unit 206. This mapping unit 202 may be configured to map the input variables to proper functions for following modulating operations. The CORDIC algorithm, a ROM table or other appropriate methods can be implemented for mapping to reduce calculating time.

The signal created by mapping unit 202 is forwarded to a first up converting unit 204. The up converting unit 204 may be implemented analogue and may comprise at least one carrier signal generator, like a voltage control oscillator (VCO), a voltage controlled crystal oscillators (VCXO) or the like. In addition, multipliers may be arranged within the up converting unit 204 for up converting.

The amplitude component A is forwarded to the arranged predistortion unit 104. The predistortion unit 104 comprises at least a first determining unit 212 and a second determining unit 214 according to the present embodiment.

In the first determining unit 212 the duty cycle function d may be calculated depending on the amplitude component A according to the function $$d = \frac{1}{\pi}\arcsin(A).$$

The achieved duty cycle d can be forwarded to the second determining unit 214 to calculate the desired phase shift function $\Phi_M(t)$ by the given function $\Phi_M=(1-2d)\hat{\Phi}_M$, whereby $$\hat{\Phi}_M = \frac{\pi}{2}.$$

The determined phase shift function $\Phi_M(t)$ is fed to the pulse width modulating unit 106 which comprises at least a second mapping unit 208 and a second up converting unit 210.

The depicted second mapping unit 208 may operate similar to the previous mentioned first mapping unit 202. The achieved suitable functions comprising the information being transmitted are forwarded to the second up converting unit 210. This up converting unit 210 can also be supplied by the at least one carrier signal comprising the information of the phase component $\Phi_p$. An additional carrier signal generator may be omitted, since the carrier signal generator of the first up converting unit 204 can be used. Easy implementation is possible. By the aid of multipliers or the like, two modulated signals can be created which comprises both the amplitude and phase information.

The two arranged modulating units 106, 206 can be implemented as a common unit, like a pulse width pulse position modulating unit according to other embodiments of the present application.

Further processing is already known and will be elucidated in more detail subsequently.

Figure 7:
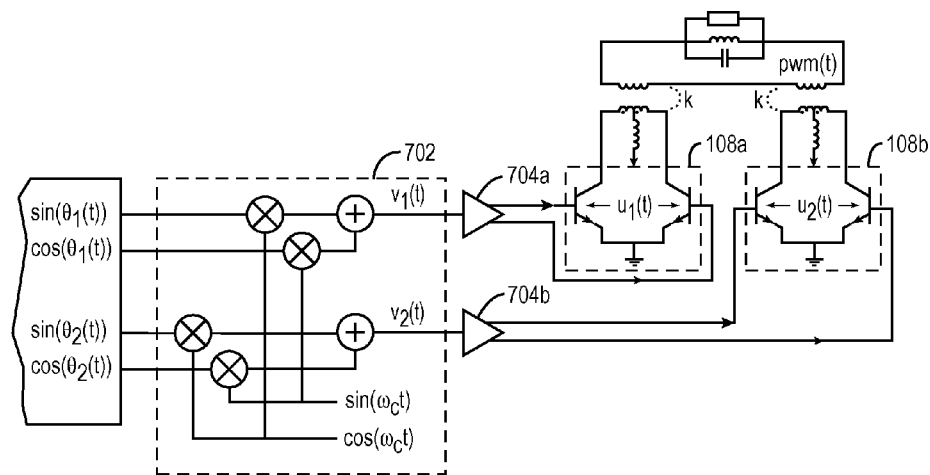
FIG. 7 a third embodiment of the apparatus according to the application.

In FIG. 7 a further embodiment of the apparatus according to the present application is shown. The apparatus includes a modulating unit 702 which assimilates the first up converting unit 204 and the second up converting unit 210. Not shown in FIG. 7 is in depth presentation of a mapping unit comprising the first mapping unit 202 and the second mapping unit 208. Depicted are only the provided four functions $\sin(\Theta_1(t))$, $\cos(\Theta_1(t))$, $\sin(\Theta_2(t))$, $\cos(\Theta_2(t))$ whereby:

$\Theta_1(t)=\Phi_P(t)+\Phi_M(t)$ and $\Theta_2(t)=\Phi_P(t)-\Phi_M(t)$.

These four trigonometric functions can be created within a digital domain meanwhile further processing can be performed in an analogue domain. For lucidity reasons, digital analogue converter are not illustrated. The four trigonometric functions are fed to the modulating unit 702. According to the present embodiment the modulating unit 702 comprises four multiplying units and two addition units. At the outputs of the modulating unit 702 two comparing units 704a, 704b are arranged. As a comparing unit 704a, 704b, a limiter or comparator can be employed. However, different implementations comprising other calculating and logical units are possible. For lucidity reasons the needed at least one carrier signal generator, for instance a voltage control oscillator (VCO), is also not shown in FIG. 7. Illustrated are only two input signals $\sin(\omega_C t)$ and $\cos(\omega_C t)$ corresponding to the carrier frequency $\omega_C$.

Furthermore, two amplifying units 108a, 108b are depicted. The shown amplifying units 108a, 108b may be a two power amplifier stage comprising switching power amplifiers. Each amplifying unit 108a, 108b may comprise two transistors as shown in FIG. 7. Other layouts of the amplifying units 108a, 108b are conceivable as well.

At the outputs of the amplifying units 108a, 108b a combining unit 110 is arranged. The combining unit 110 may be constructed by a transformer or a combiner, for instance, in micro-strip technology. Due to the fact that the shown concept is a current mode concept a parallel resonance circuit may be arranged for low pass filtering to reduce the unwanted out of band frequencies.

In the following the functioning of the apparatus shown in FIG. 7 is pointed out.

At first, the six trigonometric functions mentioned above are taken to calculating operations, like multiplying and adding in the depicted way according to FIG. 7. As results the following two functions are obtained $v_1(t)=\sin(\omega_C t+\Phi_P(t)+\Phi_M(t))$ and $v_2(t)=\sin(\omega_C t+\Phi_P(t)-\Phi_M(t))$.

The functions $v_1(t)$ and $v_2(t)$ are opposite phase shifted. In the next step the two functions are fed to the comparing units which results in two phase modulated two level signals given by $u_1(t)=\text{sign}(\sin(\omega_C t+\Phi_P(t)+\Phi_M(t)))$ and $u_2(t)=\text{sign}(\sin(\omega_C t+\Phi_P(t)-\Phi_M(t)))$.

These signals $u_1(t)$ and $u_2(t)$ are the desired opposite phase shifted two level signals. These signals can be used to construct a varying pulse width.

Each amplifying unit 108a, 108b receives a different 50% duty cycle phase shifted two level input signal $u_1(t)$ or $u_2(t)$. The output of the total apparatus may be obtained by addition of the amplified signals of both amplifying units 108a, 108b.

The shown amplifying concept comprises a high efficiency. In addition, the apparatus can be implemented easily and costly. Furthermore, AND or NOR gates can be omitted.

Figure 8:
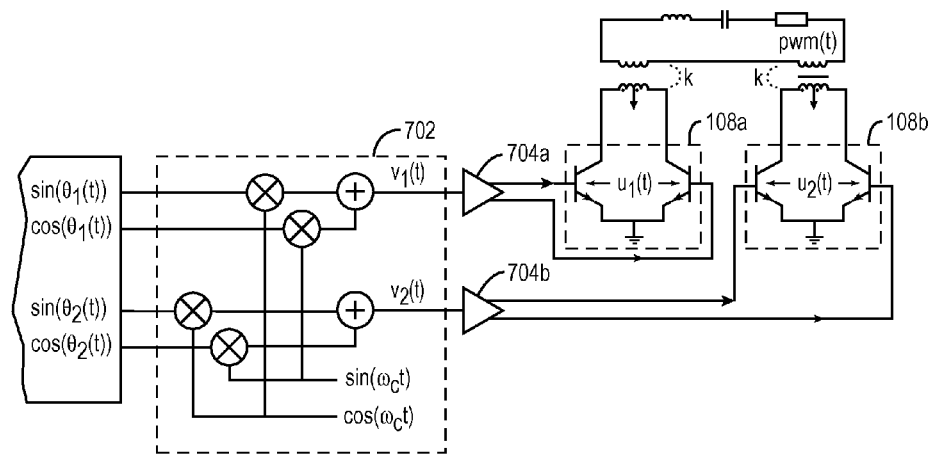
FIG. 8 a fourth embodiment of the apparatus according to the application.

FIG. 8 shows a similar apparatus. Thus, only the differentials to the above mentioned apparatus according to FIG. 7 are pointed out.

The major difference is the arranged series resonance circuit since the shown concept is a voltage mode amplifying concept. The series resonance circuit may serve as a low pass filter to reduce the unwanted out of band frequencies.

Figure 9:
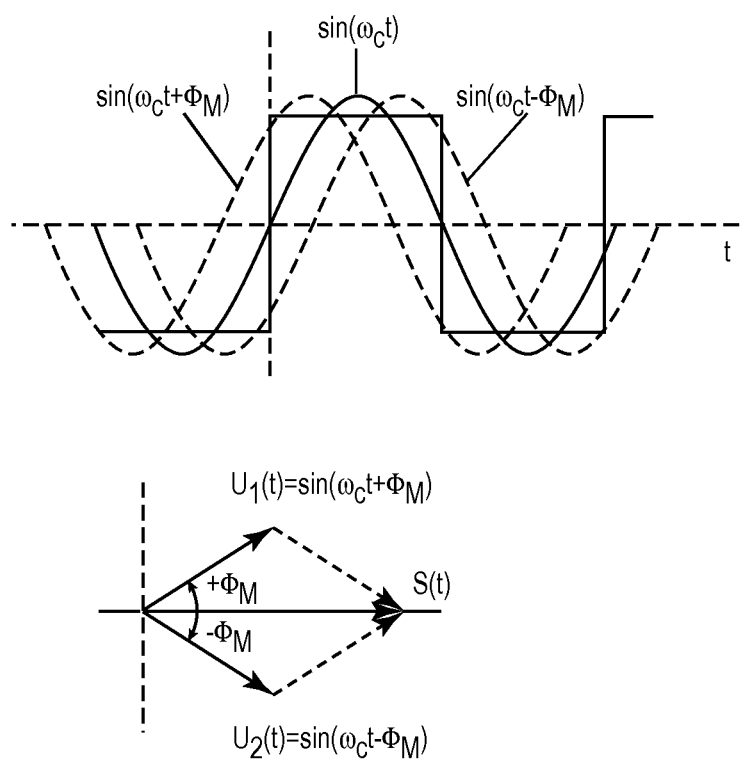
FIG. 9 an exemplary diagram of an output signal.

FIG. 9 shows an exemplary diagram of an output signal. For lucidity reasons, the depicted signal comprises only a constant phase shift $\Phi_M$ depending on the amplitude component A. Three sine function are shown, comprising a negative phase shift $-\Phi_M$, none phase shift and a positive phase shift $\Phi_M$. The relation between the phase shift function $\Phi_M(t)$ and the AM modulated carrier can be described by $$s(t)=u_1(t)+u_2(t)=\sin(\omega_C t+\Phi_M(t))+\sin(\omega_C t-\Phi_M(t))=2\cos(\Phi_M(t))\sin(\omega_{C t}).$$

For example, the depicted vector diagram shows the above relation in a demonstrative manner.

What is more, it is found according to the present application that the linearity of the transmitter can be improved by applying a feedback loop. In general an implementation of a short or a long feedback loop is possible.

Figure 10:
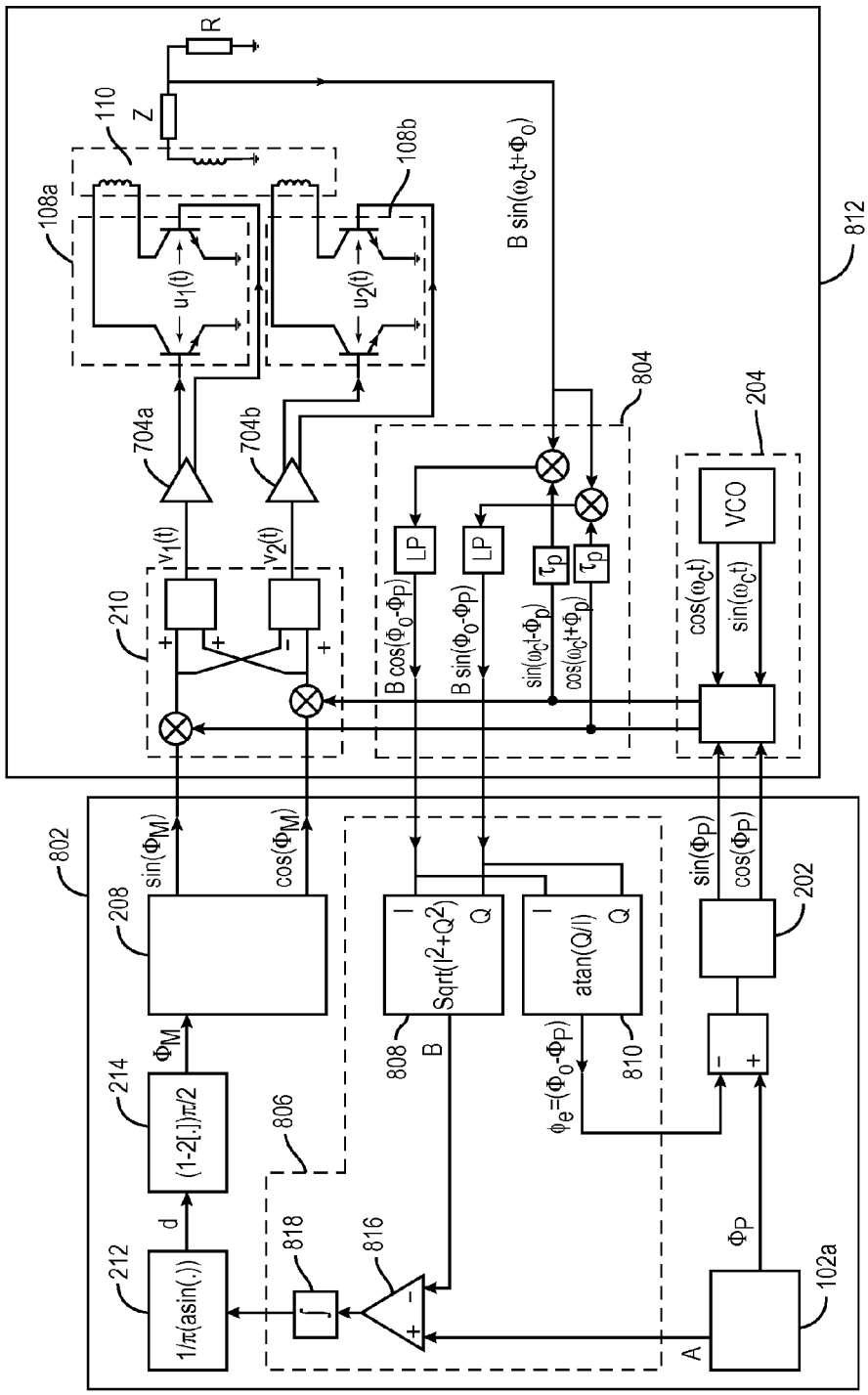
FIG. 10 a fifth embodiment of the apparatus according to the application comprising a long feedback loop.

FIG. 10 shows a fifth embodiment of the apparatus according to the present application comprising a long feedback loop. The shown apparatus comprises already known units holding the same reference signs, like determining units 212, 214, mapping units 202, 208, up converting units 204, 210, and the like.

The present apparatus can be divided into a digital domain 802 and an analogue domain 812. Other ways for dividing the apparatus into two different domains are possible.

The analogue domain 812 encompasses a converting unit 804 which is connected to the output of the combining unit 110. The shown converting unit 804 includes two multipliers, two low pass filtering units LP and two delay elements $\tau_p$. Another realization is possible.

Additionally, the digital domain 802 comprises at least a processing unit 806, like a digital signal processor (DSP). The processing unit 806 is supplied by the signals created by the down converting unit 804. In turn, the processing unit 806 includes at least an envelope detecting unit 808 and a phase detecting unit 810. Furthermore, a comparing unit 816 and an integrator 818 can be arranged within the processing unit 806.

The functioning of the apparatus shown in FIG. 10 is elucidated in the following.

At the output of the combining unit 110, the signal $s_t(t)$ being transmitted may be measured and forwarded to the down converting unit 804. The signal $s_t(t)$ being transmitted may be given by the equation $$s_t(t)=B\sin(\omega_c t+\Phi_o),$$

whereby $\Phi_o$ is the output phase and B is the amplitude component.

On the one hand signal $s_t(t)$ may be fed to a RF multiplier for multiplying with signal $\cos(\omega_c t+\Phi_P)$ delayed by factor $\tau_p$. On the other hand signal $s_t(t)$ may be fed to a RF multiplier for multiplying with signal $\sin(\omega_c t+\Phi_P)$ delayed by factor $\tau_p$, as well.

Signals $\sin(\omega_c t+\Phi_P)$ and $\cos(\omega_c t+\Phi_P)$ may be created by the separate first up converting unit 204. The delay elements $\tau_p$ are arranged to correct the delay difference between the desired and measured output phase. It may be possible to make a distinction between the desired and actual phase modulation.

As a result of the multiplication a complex base band signal can be obtained at the output of the low pass filters LP comprising an inphase component $$I(t)=B\cos(\Phi_o-\Phi_P)$$

and a quadrature component $$Q(t)=B\sin(\Phi_o-\Phi_P).$$

The actual amplitude B can be calculated by the envelope detecting unit 808 using the inphase I(t) and quadrature component Q(t). The amplitude B is given by $$B=\sqrt{I(t)^2+Q(t)^2}.$$

The actual error phase $\Phi_e$ can be calculated by the phase detecting unit 810 and is given by $$\Phi_e=(\Phi_o-\Phi_P)=\arctan\left(\frac{Q(t)}{I(t)}\right).$$

The obtained error signal $\Phi_e$ can be subtracted from the generated phase component $\Phi_p$ to achieve a corrected phase component $\Phi_p$. In addition, the amplitude component A may be corrected by comparing it with the determined amplitude component B and integrating the resulting signal. Further processing is explained above. The linearity of the signals $u_1(t)$ and $u_2(t)$ can be improved.

For clearance reasons possibly necessary components, like delay elements, analog digital converters, digital analog converters or the like are omitted. However, a person skilled in the art is able to implement such components if needed.

Figure 11:
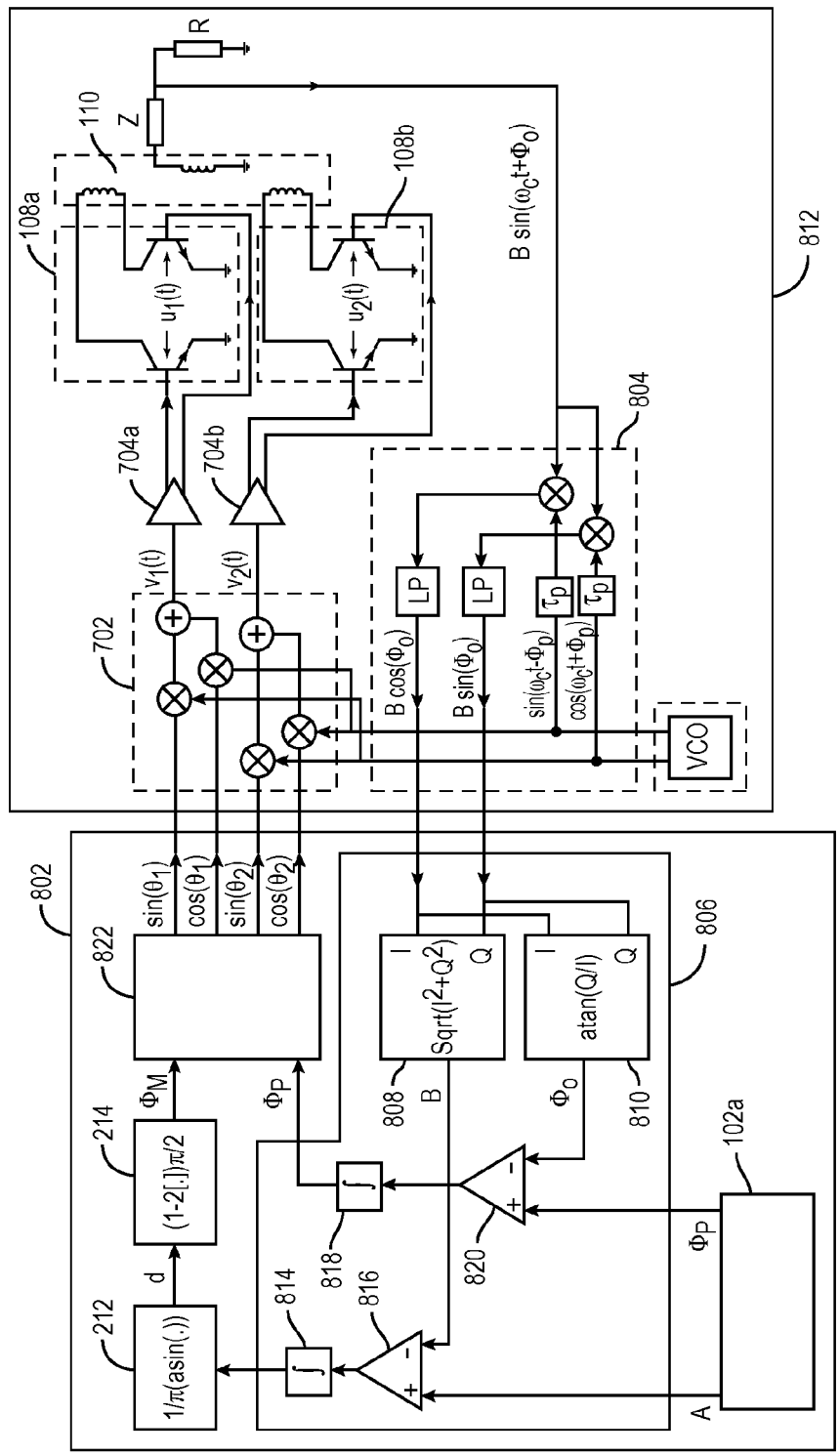
FIG. 11 a sixth embodiment of the apparatus according to the application comprising a long feedback loop.

FIG. 11 shows a sixth embodiment of the apparatus according to the present application comprising a long feedback loop. The apparatus depicted in FIG. 11 differs from the apparatus in FIG. 10 merely in some details which are described in the following.

The present apparatus encompasses a modulating unit 702 of a pulse width pulse position modulating unit. Furthermore, a mapping unit 822 of the pulse width pulse position modulating unit for mapping at least the pulse shift function $\Phi_M$ and the phase component $\Phi_p$ to suitable functions is arranged. What is more, the processing unit 806 comprises a second comparing unit 820 and a second integrator 818.

Due to the employed pulse width pulse position unit signals $\sin(\omega_c t)$ and $\cos(\omega_c t)$ are delayed and fed to the multipliers arranged within the converting unit 804. After multiplying and low pass filtering the complex base band signal can be obtained comprising the inphase component $$I(t)=B\cos(\Phi_o)$$

and the quadrature component $$Q(t)=B\sin(\Phi_o).$$

The output phase $\Phi_o$ calculated by the phase detecting unit 810 is fed to the arranged second comparing unit 820 and the compared signal may be integrated by the additional second integrator 818. The remaining processing steps are already known and they are not explained again. The linearity of the signals $u_1(t)$ and $u_2(t)$ being amplified can be improved.

Figure 12:
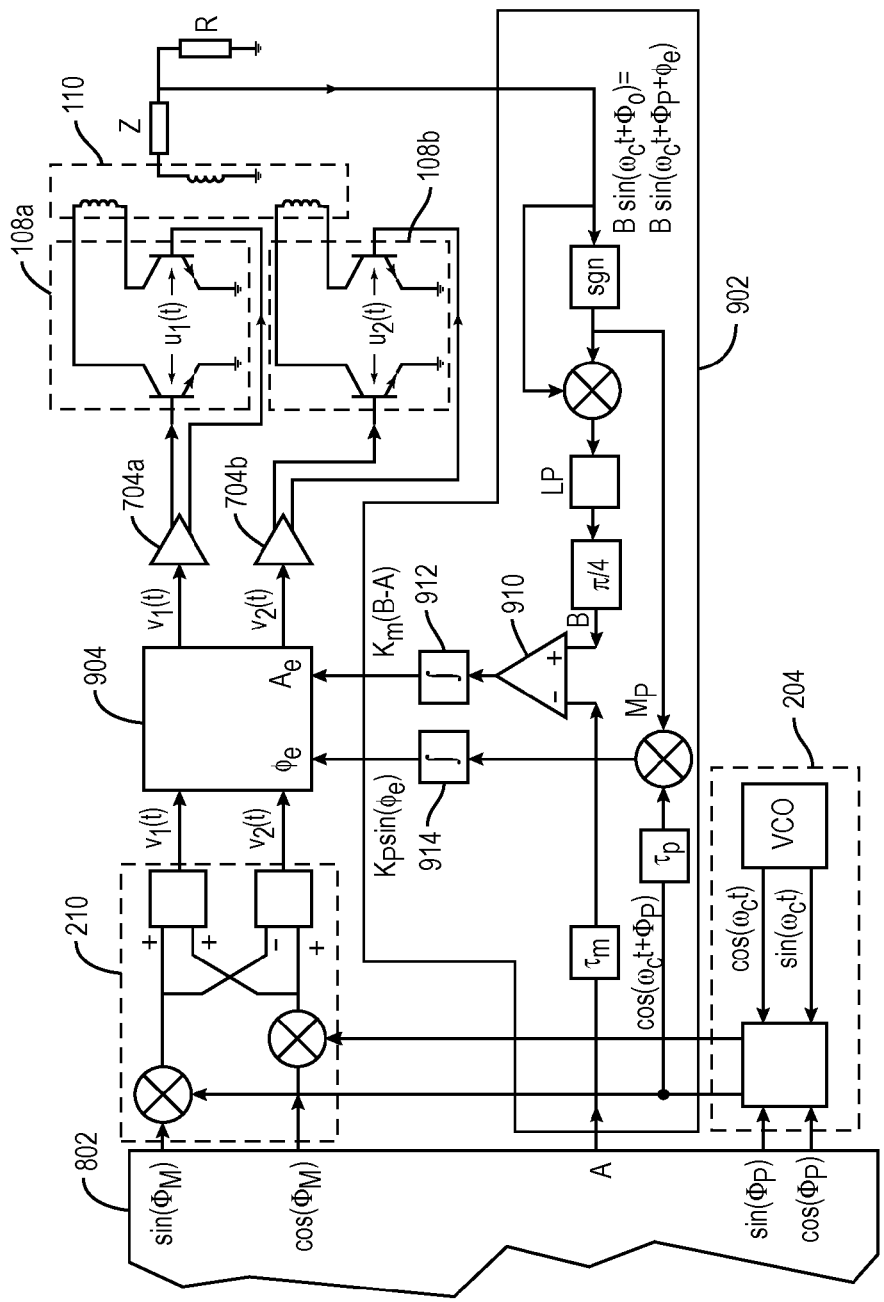
FIG. 12 a seventh embodiment of the apparatus according to the application comprising a short feedback loop.

Another possibility to implement a feedback loop is depicted in FIG. 12. FIG. 12 shows a further embodiment of the apparatus according to the present application comprising a short feedback loop. This short feedback loop is only implemented within the analogue domain.

The already known units are not mentioned again and hold also the same reference signs. The shown apparatus includes at least an amplitude and phase correcting unit 904 and a down converting and error detecting unit 902.

In turn, the down converting and error detecting unit 902 comprises several components, like two integrators 912, 914, a low pass filter LP, two delay elements $\tau_p$, $\tau_m$, a comparing unit 910, two RF-multipliers, a sgn operator and a constant multiplication factor $\pi/4$.

The functioning of the apparatus shown in FIG. 12 is elucidated in the following.

The measured signal $s_t(t)$ can be depicted in more detail as $$s_t(t)=B(t)\sin(\omega_c t+\Phi_o)=B(t)\sin(\omega_c t+\Phi_o+\Phi_e).$$

At first, the amplitude path is explained. For obtaining amplitude $B(t)$, the measured signal $s_t(t)$ can be processed as follows $$B(t)\sin(\omega_c t+\Phi_o+\Phi_e)\times\sin(\omega_c t+\Phi_o+\Phi_e))$$

by the arranged multiplier and sgn operator. After low pass filtering and scaling the desired amplitude $B(t)$ can be obtained $$B(t)=\frac{4}{\pi}B(t)\frac{\pi}{4}.$$

The obtained amplitude $B(t)$ can be compared with the delayed desired amplitude $A(t-\tau_m)$ by the comparing unit 910. For example, a comparator can be used. The resulting signal can be integrated by integrator 912 resulting in signal $$Int_1(t)=K_m(B(t)-A(t-\tau_m)),$$

whereby $K_m$ is a constant gain factor.

This signal $Int_1(t)$ can be fed to the amplitude and phase correcting unit 904 for correcting the phase shift function $\Phi_M(t)$.

For correcting the phase component $\Phi_p$ properly, the real sliced RF carrier can be multiplied with the desired complex RF carrier. The resulted output signal can be forwarded to integrator 914, whereby the following signal can be achieved $$Int_2(t)=K_p\sin(\Phi_e),$$

whereby $K_p$ is a constant gain factor. Signal $Int_2(t)$ can also be used for correcting signals $v_1(t)$ and $v_2(t)$. A detailed elucidation of correcting signals $v_1(t)$ and $v_2(t)$ occurs subsequently.

Figure 13:
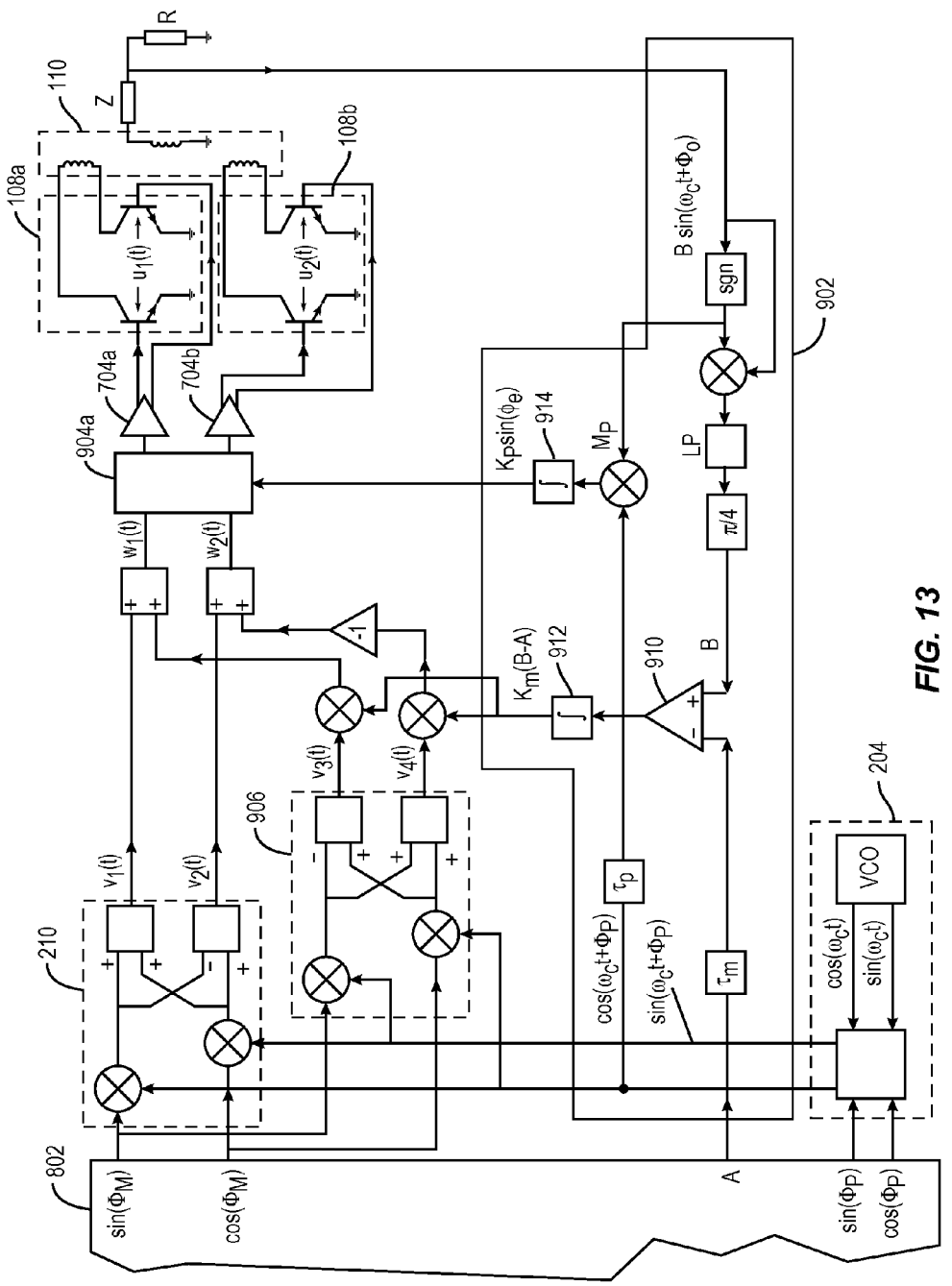
FIG. 13 an eighth embodiment of the apparatus according to the application comprising a short feedback loop.

In FIG. 13 a further embodiment of the apparatus according to the present application comprising a short feedback loop is shown. The apparatus includes also a down converting and error detecting unit 902. Furthermore, the apparatus encompasses a phase shifting unit 904a and an additional third up converting unit 906. The third up converting unit 906 may be implemented similarly to up converting unit 210. Further components, like multipliers, adders and inverters, can also be arranged additionally within the shown embodiment.

The input signals of the up converting units 210, 906 are $$\sin(\Phi_M),$$

$$\cos(\Phi_M),$$

$$\sin(\omega_c t+\Phi_P),$$

$$\cos(\omega_c t+\Phi_P).$$

These signals are processed by the up converting units 210, 906 in the manner shown in FIG. 12 resulting in the following four signals:

$$v_1(t)=\sin(\omega_c t+\Phi_P(t)+\Phi_M(t)),$$

$$v_2(t)=\sin(\omega_c t+\Phi_P(t)-\Phi_M(t)),$$

$$v_3(t)=\cos(\omega_c t+\Phi_P(t)+\Phi_M(t)),$$

$$v_4(t)=\cos(\omega_c t+\Phi_P(t)-\Phi_M(t)).$$

It is found that for correcting the amplitude component and the phase shifting function $\Phi_M(t)$, respectively, signals $v_3(t)$ and $v_4(t)$ can be multiplied by signal $$Int_1(t)=K_m(B(t)-A(t-\tau_m)).$$

Resulting signals are added to signals $v_1(t)$ and $v_2(t)$ and following signals $$w_1(t)=v_1(t)+K_m(B(t)-A(t-\tau_m))v_3(t),$$

$$w_2(t)=v_2(t)-K_m(B(t)-A(t-\tau_m))v_4(t)$$

can be achieved.

For the case the envelope signal is larger than desired, term $B(t)-A(t-\tau_m)$ is greater than zero. Thus the phase shift function $\Phi_M(t)$ increases which results in a smaller duty cycle and in a smaller corrected carrier signal, respectively.

The signals $w_1(t)$ and $w_2(t)$ are fed to phase shifting unit 904a for correcting the phase component depending on signal $$Int_2(t)=K_p\sin(\Phi_e).$$

For example, a filter can be arranged for varying the phase by controlling a resistor, varicap or the like. Advantageously an all pass filter having a varying delay can be chosen. Fewer problems for the comparator units 704a, 704b can be achieved due to a constant envelope of the carrier signals.

Figure 14:
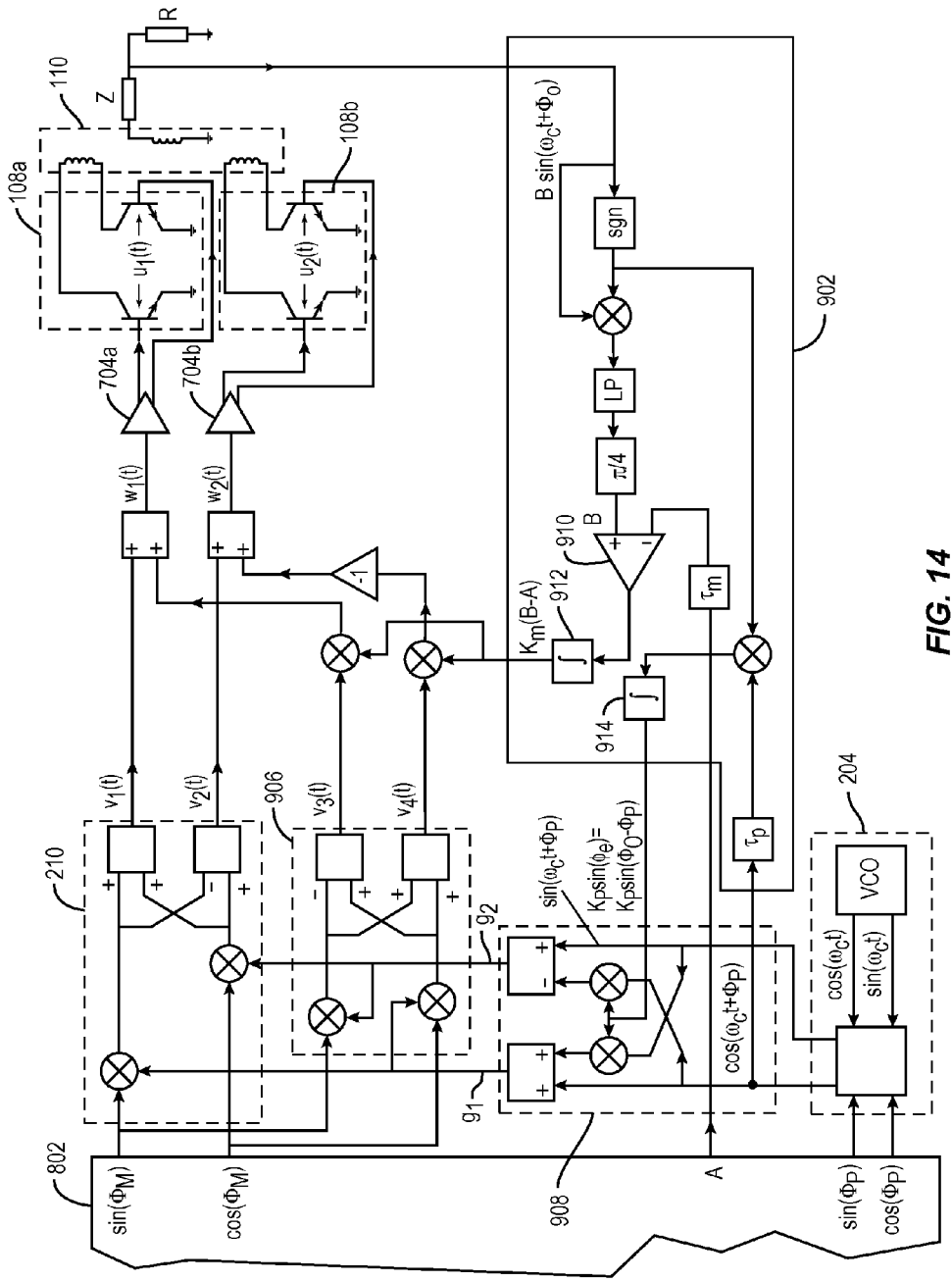
FIG. 14 a ninth embodiment of the apparatus according to the application comprising a short feedback loop.

In FIG. 14 a further embodiment of the apparatus according to the present application comprising also a short feedback loop is shown. The shown apparatus encompasses another phase correction unit 908. The phase correction unit 908 includes two multipliers and two adders. Further units, like down converting and error detecting unit 902 or up converting units 204, 210, 906, are already known and hold the same reference signs.

The outgoing signals $\sin(\omega_c t+\Phi_P)$, $\cos(\omega_c t+\Phi_P)$ of up converting unit 204 can be forwarded to phase correction unit 908 and can be multiplied with signal $$Int_2(t)=K_p\sin(\Phi_e).$$

The resulting signals can be forwarded to the adders arranged within the phase correction unit 908. This may yield to the following signals $$g_1(t)=\cos(\omega_c t+\Phi_P(t))+K_p\sin(\Phi_e)\sin(\omega_c t+\Phi_P(t)).$$

$$g_2(t)=\sin(\omega_c t+\Phi_P(t))-K_p\sin(\Phi_e\cos(\omega_c t+\Phi_P(t)).$$

The functioning can be depicted for the case of an unwanted increase of the output phase $\Phi_O$. This increase results in a positive increase of the error signal $$Int_2(t)=K_p\sin(\Phi_e).$$

In turn, this causes a negative rotation of the signals $g_1(t)$ and $g_2(t)$.

The phase error detection can be performed independently from the RF frequency. What is more, the implemented feedback loop can be very short.

The advantage of the above elucidated short feedback loops is that they are implemented totally within the analogue domain which may result in a greater bandwidth.

The application has been described above by means of exemplary embodiments. It should be noted that there are alternative ways and variations which are obvious to a skilled person in the art and can be implemented without deviating from the scope and spirit of the appended claims.

Furthermore, it is readily clear for a skilled person that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. An apparatus comprising:
a signal generator configured to generate a signal;
a predistortion unit configured to pre-distort the generated signal;
a pulse width modulating unit configured to modulate the pre-distorted signal onto two signals, each being opposite phase shifted;
at least two amplifying units each configured to amplify one of the two modulated signals;
a combining unit configured to combine at least two amplified signals; and
a feedback loop path configured to correct the generated signal depending on a combined signal generated by the combining unit.

2. The apparatus according to claim 1, wherein the signal generator is configured to generate a polar signal.

3. The apparatus according to claim 1, wherein at least one amplifying unit is a switching power amplifier.

4. The apparatus according to claim 1, wherein the predistortion unit is configured to determine a phase shift function depending on the generated signal.

5. The apparatus according to claim 1, wherein the predistortion unit comprises a first determining unit configured to determine a duty cycle function depending on the generated signal.

6. The apparatus according to claim 1, further comprising a pulse position modulating unit configured to process a phase component of the generated signal.

7. The apparatus according to claim 1, wherein the feedback loop path comprises a converting unit configured for down converting the combined signal.

8. The apparatus according to claim 1, wherein the feedback loop path comprises a processing unit configured to correct the generated signal depending on the down converted signal.

9. The apparatus according to claim 1, wherein the feedback loop path comprises a down converting and error detecting unit.

10. The apparatus according to claim 1, wherein the feedback loop path comprises an amplitude and/or phase correcting unit.

11. The apparatus according to claim 1, wherein the feedback loop path comprises a phase shifting unit.

12. The apparatus according to claim 1, wherein the feedback loop path comprises a phase correction unit.

13. The apparatus according to claim 5, wherein the predistortion unit comprises a second determining unit configured to determine the phase shift function depending on the determined duty cycle function.

14. The apparatus according to claim 6, wherein the pulse position modulating unit comprises a first mapping unit configured to map the phase component to at least one suitable function according to a chosen implementation of the pulse position modulating unit.

15. The apparatus according to claim 6, wherein the pulse position modulating unit comprises a first up converting unit.

16. The apparatus according to claim 6, wherein the pulse width modulating unit and the pulse position modulating unit are arranged as one pulse width pulse position modulating unit.

17. The apparatus according to claim 8, wherein the processing unit comprises at least one of:
an envelope detecting unit; and
a phase detecting unit.

18. The apparatus according to claim 14, wherein the pulse width modulating unit comprises a second mapping unit configured to map the phase shift function to at least one suitable function according to a chosen implementation of the pulse width modulating unit.

19. The apparatus according to claim 15, wherein the pulse width modulating unit comprises a second up converting unit.

20. The apparatus according to claim 19, wherein the pulse width modulating unit comprises a third up convening unit.

21. A method comprising:
generating a signal;
pre-distorting the generated signal;
pulse width modulating the pre-distorted signal onto at least into two signals, each being opposite phase shifted;
amplifying at least the two modulated signals;
combining at least two amplified signals; and
correcting the generated signal depending on the combined signal.

22. A non-transitory computer readable medium having a computer program stored thereon, the computer program comprising instructions operable to cause a processor to perform the steps of:
generating a signal;
pre-distorting the generated signal;
pulse width modulating the pre-distorted signal onto at least into two signals, each being opposite phase shifted;
amplifying at least the two modulated signals;
combining at least two amplified signals; and
correcting the generated signal depending on the combined signal.

23. A transmitter comprising an apparatus comprising:
a signal generator configured to generate a signal;
a predistortion unit configured to pre-distort the generated signal;
a pulse width modulating unit configured to modulate the pre-distorted signal onto at least two signals, each being opposite phase shifted;
at least two amplifying units each configured to amplify one of the two modulated signals;
a combining unit configured to combine at least two amplified signals; and
a feedback loop path configured to correct the generated signal depending on a combined signal generated by the combining unit.

* * * * *